United States Patent

Theunis

[11] Patent Number: 5,943,367
[45] Date of Patent: Aug. 24, 1999

[54] TRANSMISSION SYSTEM USING TIME DEPENDENT FILTER BANKS

[75] Inventor: Hendrik G.J. Theunis, Eindhoven, Netherlands

[73] Assignee: U.S. Philips Corporation, New York, N.Y.

[21] Appl. No.: 08/715,951

[22] Filed: Sep. 19, 1996

[30] Foreign Application Priority Data

Sep. 22, 1995 [EP] European Pat. Off. .............. 95202568

[51] Int. Cl.$^6$ .................................................. H04B 15/00
[52] U.S. Cl. .................. 375/285; 364/724.19; 375/350; 375/296; 370/484
[58] Field of Search ............................ 364/724.011, 825, 364/724.19, 602; 375/254, 285, 298, 346, 350, 259, 296, 348, 351; 704/229, 230, 220, 258, 269; 370/484

[56] References Cited

U.S. PATENT DOCUMENTS

| | | | |
|---|---|---|---|
| 4,799,179 | 1/1989 | Masson et al. ...................... | 364/724.1 |
| 4,901,075 | 2/1990 | Vogel ........................................ | 341/63 |
| 5,109,417 | 4/1992 | Fielder et al. ............................. | 381/36 |
| 5,394,473 | 2/1995 | Davidson ................................... | 381/36 |
| 5,490,233 | 2/1996 | Kovacevic ............................... | 395/2.39 |
| 5,568,142 | 10/1996 | Velazquez et al. ..................... | 341/126 |

OTHER PUBLICATIONS

"Exact Reconstruction Analysis/Synthesis . . . " by J.L. Arrowood Jr. and M.J.T. Smith as published in 1993 IEEE International Conference on Acoustics, Speech, and Signal Processing, vol. III, Digital Speech Processing, pp. 233–236.

*Primary Examiner*—Jason Chan
*Assistant Examiner*—Jean B. Corrielus
*Attorney, Agent, or Firm*—Laurie E. Gathman

[57] ABSTRACT

In source coding, use can be made of switching filter banks in order to adapt the filter bank to the properties of the signal to be coded. If it is not allowed that the switching introduces transient phenomena in the reconstructed signal, so-called boundary filters have to be used in the system according to the present invention, it is possible to dispose with the transition filters without introducing undesired transient phenomena. In order to obtain said property the new filter coefficients (after switching) have to be a linear combination of the original filter coefficients (before switching).

12 Claims, 3 Drawing Sheets

TRANSMISSION SYSTEM USING TIME DEPENDENT FILTER BANKS

BACKGROUND OF THE INVENTION

The invention is related to a transmission system with a transmitter comprising a time dependent analysis filter bank for deriving from at least one input signal at least two filtered signals, encoding means for deriving encoded signals from the filtered signals, and transmitting means for transmitting the encoded signals to a receiver via a transmission medium, said receiver comprising decoding means for deriving said filtered signals from the encoded signals and a time dependent synthesis filter bank for reconstructing said at least one input signal from the filtered signals.

The invention is also related to a transmitter, a receiver a coder, a decoder and a method for coding and decoding.

A transmission system according to the preamble is known from the conference paper "Exact Reconstruction Analysis/Synthesis Filter Banks with Time Varying Filters" by J. L. Arrowood Jr. and M. J. T. Smith as published in the conference proceedings of the 1993 IEEE International Conference on Acoustics, Speech, and Signal Processing, Volume III, Digital Speech Processing, pp. 233–236.

Such transmission systems can be used for transmitting audio or video signals by means of a transmission medium like a radio channel, a coaxial cable or a glass fibre. It is also possible to use such transmission systems for recording of speech or video signals on a recording medium such as a magnetic tape or disc. Applications for such recording are automatic answering machined, digital video recorders or video servers for video on demand applications.

Digital transmission or recording of audio and video data involves huge amounts of bits to be transmitted or to be stored. To reduce these amounts of bits, numerous types of coders have been developed. Some of said coders use an analysis filter bank which derives at least two filtered signals from an input signal. Each of said filtered signals is converted into an encoded signal using a coding method suitable for it. In general, the sampling rate of the filtered signals will be reduced before encoding in order to keep the total number of samples representing the input signal(s) constant. The reduced bandwidth of each of the filtered signals allows such sampling rate reduction. The coding of the output signals of the filter bank can comprise a quantisation step followed by a lossless coding step.

The encoded signal is transmitted to a receiver which comprises decoding means which convert the encoded signals back into at least two signals. From these at least two signals a replica of the input signal of the transmitter is reconstructed by using a synthesis filter bank.

This approach allows the coding method used for each of the filtered signals to be adapted to the properties of said signals. It has turned out that the use of this approach results in an improved ratio between coding quality versus bitrate for certain types of signals.

In the system according to the above mentioned conference paper it is proposed to use time varying analysis and synthesis filter banks. The use of time varying filter banks has the advantage that the characteristics of the filter banks can be adapted to the input signal to be coded, resulting into further improved coding properties. By using time varying filter banks, transition phenomena can occur when the properties of the filter banks are changed in time. To reduce these transient phenomena, in the system according to the above mentioned conference paper so-called transition filters are used. These transition filters compensate for distortion of the signal to be encoded during the change from one bank of analysis filters to a different bank of filters.

Due to the presence of transition filters the number of changes in the filter banks per unit of time is limited. This means that for input signals having fast changing properties, such like video signals, the filter banks can not be adapted fast enough to follow the changing properties of the signal to be encoded.

SUMMARY OF THE INVENTION

The object of the present invention is to provide a transmission system according to the preamble which can be adapted faster to the changing properties of the signal to be encoded.

Therefore the transmission system is characterised in that the transmitter comprises transmit switching means for changing the filter coefficients of the time dependent analysis filter bank according to a first linear transformation, and in that the receiver comprises second switching means for changing the filter coefficients of the synthesis filter bank according to a second linear transformation being an inverse of the first linear transformation.

By changing the coefficients of the analysis filter bank according to a first linear transformation and changing the coefficients of the synthesis filter bank according to a second linear transformation being an inverse of the first linear transformation, no transition filters are required at all. Due to the inverse relationship between the first and the second linear transformation it is ensured that the overall transfer function of the transmission system is not changed after switching. It is observed that it may occur that the second transformation is not completely an inverse of the first transformation, but that the second transformation acts as an inverse transformation for the relevant data it operates on. There exist linear transformations which are an inverse of each other only in a limited range of the data they operate on. If said data is limited to said range, the second transformation can be regarded as an inverse of the first transformation.

A further embodiment of the invention is characterised in that the first switching means are arranged for instantaneously changing the filter coefficients of the time dependent analysis filter bank, and in that the second switching means arranged for instantaneously changing the impulse response of the synthesis filter bank.

Using these measures it is possible to have a perfect reconstructing filterbank even around a switching instant. This property will be showed in the detailed description of the invention.

BRIEF DESCRIPTION OF THE DRAWINGS

The invention will now be explained with reference to the accompanying drawings.

Herein shows.

DETAILED DESCRIPTION OF THE PREFERRED EMBODIMENTS

Figure 1:
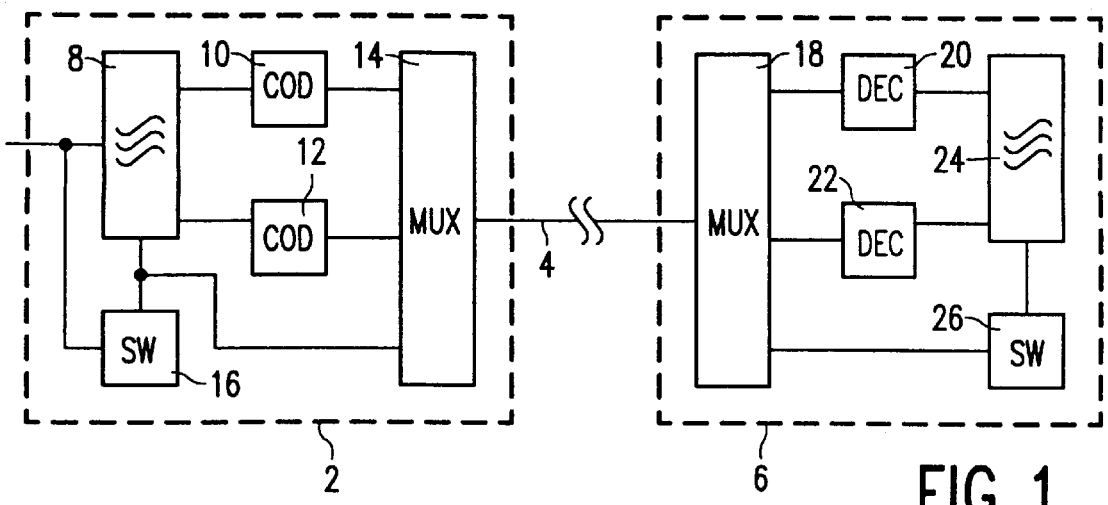
FIG. 1, a block diagram of a transmission system according to the invention.

In the transmission system according to FIG. 1, a signal to be transmitted is applied to a transmitter 2. The input of the transmitter 2 is connected to an analysis filter bank 8 and to transmit switching means 16. An output of the filter determination circuit provides a switching signal to the analysis filter bank 8 and to a first input of a multiplexer A first output of the analysis filter bank 8 is connected to an input of a coder 10, and a second output of the filter bank 8 is connected to an input of a second coder 12. It is observed that the filterbank can have more than two outputs and that the transmitter comprises more than two coders. It is even possible that the number of outputs of the filter bank 8 and the number of coders 10 . . . 12 varies in time. The coder 10 and the coder 12 constitute the coding means.

The output of the first coder 10 is connected to a second input of the multiplexer 14, and the output of the second coder 12 is connected to a third input of the multiplexer 14.

The output signal of the multiplexer is transmitted via the transmission medium 4 to a receiver 6. The input of the receiver 6 is connected to a demultiplexer 18. A first output of the demultiplexer 18 is connected to receive switching means 26. A second output of the demultiplexer 18 is connected to an input of a first decoder 20, and a third output of the demultiplexer 18 is connected to an input of a second decoder 22. The output of the first decoder is connected to a first input of a synthesis filter bank 24, and the output of the second decoder is connected to a second input of the synthesis filter bank 24. An output of the receive switching means 26 is connected to a switching input of the synthesis filter bank 24. At the output of the filter bank 24 the reconstructed signal is available.

In the transmitter 2 the input signal is transformed by the analysis filter bank into a plurality N of sub-band signals. In general the sampling frequency of each of the sub-band signals is reduced by a factor N with respect to the sampling frequency of the input signal. The input signal of the analysis filter bank 8 can be represented by an infinite vector $\vec{u} = (\ldots, u_{m-1}, u_m, u_{m+1}, \ldots)^T$, $u_i$ being subsequent samples of the input signal, and $(\ldots)^T$ means the transposed vector. The output signals of the analysis filter bank 8 can be represented by an infinite vector $\vec{y} = (\ldots, y_{1,n-1}, y_{2,n-1}, \ldots, y_{N,n-1}, \ldots, y_{1,n}, y_{2,n}, \ldots, y_N, \ldots y_{1,n+1}, y_{2,n+1}, \ldots, y_{N,n+1}, \ldots)^T$ For the relation between $\vec{u}$ and $\vec{y}$ can be written $\vec{y} = A\vec{u}$, with A=

$$A = \begin{bmatrix} \ddots & \vdots & \vdots & \vdots & & \vdots & & \\ h_{1,M-1} & \cdots & \cdots & \cdots & & \cdots & h_{1,1} & h_{1,0} \\ h_{2,M-1} & \cdots & \cdots & \cdots & & \cdots & \cdots & h_{2,0} \\ \vdots & \cdots & \cdots & \cdots & & \cdots & \cdots & \vdots \\ h_{N,M-1} & \cdots & \cdots & h_{N,M-N-1} & \cdots & \cdots & h_{N,0} & \\ & & h_{1,M-1} & \cdots & \cdots & \cdots & & \cdots & h_{1,1} & h_{1,0} \\ & & h_{2,M-1} & \cdots & \cdots & \cdots & & \cdots & \cdots & h_{2,0} \\ & & \vdots & \cdots & \cdots & \cdots & & \cdots & \cdots & \vdots \\ & & h_{N,M-1} & \cdots & \cdots & h_{N,M-N-1} & \cdots & \cdots & h_{N,0} \\ & & & & h_{1,M-1} & \cdots & \cdots & \cdots & & \cdots & h_{1,1} & h_{1,0} \\ & & & & h_{2,M-1} & \cdots & \cdots & \cdots & & \cdots & \cdots & h_{2,0} \\ & & & & \vdots & \cdots & \cdots & \cdots & & \cdots & \cdots & \vdots \\ & & & & h_{N,M-1} & \cdots & \cdots & h_{N,M-N} & \cdots & \cdots & h_{N,0} \\ & & & & & & \vdots & \vdots & \vdots & \vdots & \ddots \end{bmatrix} \quad (1)$$

In (1) $h_{i,j}$ is the $j^{th}$ sample of the impulse response of the $i^{th}$ filter in the filter bank 14, M is the length of the impulse response of the filters in the filter bank, and N is the number of filters in the filter bank. The operator A comprises blocks defining the actual filter coefficients, which blocks are repeated periodically. The subsequent blocks are shifted over a distance N in horizontal direction with respect to each other if the number of samples per unit of time representing the complete set of subband signals remains constant. In general the horizontal shift is equal to the decimation factor of the subband signals. In the above mentioned case the decimation factor of the subband signals is equal to the number of subbands.

The output signals of the filter bank are reduced in sample rate and coded by the coders 10 . . . 12, in order to reduce the bit rate for transmission. The coders 10 . . . 12 are arranged for quantising the decimated output signals of the filter bank to obtain a first bit rate reduction. The quantised signal are encoded using a loss less coding scheme to obtain a further bit rate reduction. Such combination of quantising and loss less coding is disclosed in U.S. Pat. No. 4,901,075, which is incorporated by reference herein.

The encoded signals, together with the output signal of the transmit switching means are multiplexed by the multiplex to a bit stream, and are transmitted to the receiver 6. In the receiver 6 the bit stream is demultiplexed, in order to obtain the coded signals and the switching signal. The decoded signals at the output of the demultiplexer 18 are decoded by the decoders 20 . . . 22. The output signals of the decoders 20 . . . 22, are synthesized to an output signal under control of the switching signal at the output of the demultiplexer 18. The switching signal indicated the instants at which the synthesis filter bank 24 has to be switched. The switching signal can carry all new filter parameters, but it is more likely that the switching signal carries an index of a set from a plurality of sets of predetermined filter coefficients.

The output signals of the decoders 20 . . . 22 are represented by the infinite vector $\vec{y}$ as defined above. It is observed that the output signals of the decoders 20 . . 22 will differ slightly from the output signals of the analysis filter 8 due to quantisation. This difference however is neglected in describing the system.

The output signal of the synthesis filter bank 24 can be represented by an infinite vector $\vec{z} = (\ldots, z_{k-1}, z_k, z_{k+1}, \ldots)^T$. $z_i$ constituting subsequent samples of the output signal of the synthesis filter bank 24. For $\vec{z}$ can be written $\vec{z} = S\vec{y}$, with S being the synthesis matrix describing the synthesis filter bank 24. For S can be written:

$$S = \begin{bmatrix}
\ddots & & & & & & & \\
\vdots & g_{1,0} & \cdots \cdots & g_{N,0} & & & & \\
\vdots & g_{1,1} & \cdots \cdots & \vdots & & & & \\
\vdots & \vdots & \cdots \cdots & \vdots & & & & \\
\vdots & \vdots & \cdots \cdots & g_{N,N} & g_{1,0} & \cdots \cdots & g_{N,0} & \\
\vdots & & \cdots \cdots & \vdots & g_{1,1} & \cdots \cdots & \vdots & \\
\vdots & & \cdots \cdots & \vdots & \vdots & \cdots \cdots & \vdots & \\
\vdots & & \cdots \cdots & \vdots & \vdots & \cdots \cdots & \vdots & \\
g_{1,M-1} & \cdots \cdots & g_{N,M-1} & \vdots & \cdots \cdots & g_{N,N} & g_{1,0} & \cdots \cdots & g_{N,0} \\
& & & \vdots & \cdots \cdots & \vdots & g_{1,1} & \cdots \cdots & \vdots \\
& & & \vdots & \cdots \cdots & \vdots & \vdots & \cdots \cdots & \vdots \\
& & & \vdots & \cdots \cdots & \vdots & \vdots & \cdots \cdots & \vdots \\
& & & g_{1,M-1} & \cdots \cdots & g_{N,M-1} & \vdots & \cdots \cdots & g_{N,N} & \vdots \\
& & & & & & \vdots & \cdots \cdots & \vdots & \vdots \\
& & & & & & \vdots & \cdots \cdots & \vdots & \vdots \\
& & & & & & g_{1,M-1} & \cdots \cdots & g_{N,M-1} & \vdots \\
& & & & & & & & & \ddots
\end{bmatrix} \quad (2)$$

In (2) $g_{i,j}$ is the $j^{th}$ sample of the impulse response of the $i^{th}$ filter in the synthesis filter bank 24.

For a perfect reconstructing system the operation of the synthesis filterbank 24 must be inverse to the operation of the analysis filter bank 14. This can be expressed by $S \cdot A = I$.

According to the invention it is foreseen to alter the analysis filter bank 8 and the synthesis filterbank 24 in time in dependence on the properties of the signals received. Consequently a criterion has to be available to judge whether a switch of the filter parameters is necessary. A possibility is to perform a complete analysis, coding, decoding and synthesis operation with a limited number of set of different filter bank parameters, and to select that set of filter bank parameters leading to the best coding performance for a particular part of the input signal.

If the set of filter bank coefficients is changed, the operator A changes into:

$$A = \begin{bmatrix}
\ddots & \vdots & \vdots & \vdots & & & & & & & & \\
h_{1,M-1} & \cdots \cdots & \cdots & \cdots & h_{1,1} & h_{1,0} & & & & & & \\
h_{2,M-1} & \cdots \cdots & \cdots & \cdots & \cdots & h_{2,0} & & & & & & \\
\vdots & \cdots \cdots & \cdots & \cdots & \cdots & \vdots & & & & & & \\
h_{N,M-1} & \cdots \cdots & h_{N,M-N-1} & \cdots & \cdots & h_{N,0} & & & & & & \\
& & h_{1,M-1} & \cdots \cdots & \cdots & \cdots & h_{1,1} & h_{1,0} & & & & \\
& & h_{2,M-1} & \cdots \cdots & \cdots & \cdots & \cdots & h_{2,0} & & & & \\
& & \vdots & \cdots \cdots & \cdots & \cdots & \cdots & \vdots & & & & \\
& & h_{N,M-1} & \cdots \cdots & h_{N,M-N-1} & \cdots & \cdots & h_{N,0} & & & & \\
& & & & f_{1,Q-1} & \cdots \cdots & \cdots & \cdots & f_{1,1} & f_{1,0} & & \\
& & & & f_{2,Q-1} & \cdots \cdots & \cdots & \cdots & \cdots & f_{2,0} & & \\
& & & & \vdots & \cdots \cdots & \cdots & \cdots & \cdots & \vdots & & \\
& & & & f_{P,Q-1} & \cdots \cdots & f_{P,Q-P-1} & \cdots & \cdots & f_{P,0} & & \\
& & & & & & & \vdots & \vdots & \vdots & \ddots
\end{bmatrix} \quad (3)$$

In (3) P is the number of analysis filter after the change of the filter bank, Q is the length of the impulse response of the filters after the change of the filter bank, and $f_{i,j}$ are the coefficients of the changed filter bank. The operator S changes into $$\begin{bmatrix}
\cdot \cdot \cdot & \vdots & & & & & & & & \\
& g_{1,0} & \cdots & \cdots & g_{N,0} & & & & & \\
& g_{1,1} & \cdots & \cdots & \vdots & & & & & \\
& \vdots & \cdots & \cdots & \vdots & & & & & \\
& \vdots & \cdots & \cdots & g_{N,N} & g_{1,0} & \cdots & \cdots & g_{N,0} & \\
& \vdots & \cdots & \cdots & \vdots & g_{1,1} & \cdots & \cdots & \vdots & \\
& \vdots & \cdots & \cdots & \vdots & \vdots & \cdots & \cdots & \vdots & \\
& \vdots & \cdots & \cdots & \vdots & \vdots & \cdots & \cdots & \vdots & \\
& g_{1,M-1} & \cdots & \cdots & g_{N,M-1} & \vdots & \cdots & \cdots & g_{N,N} & l_{1,0} & \cdots & \cdots & l_{P,0} \\
& & & & & \vdots & \cdots & \cdots & \vdots & l_{1,1} & \cdots & \cdots & \vdots \\
& & & & & \vdots & \cdots & \cdots & \vdots & \vdots & \cdots & \cdots & \vdots \\
& & & & & \vdots & \cdots & \cdots & \vdots & \vdots & \cdots & \cdots & \vdots \\
& & & & & g_{1,M-1} & \cdots & \cdots & g_{N,M-1} & \vdots & \cdots & \cdots & l_{P,P} & \vdots \\
& & & & & & & & & \vdots & \cdots & \cdots & \vdots & \vdots \\
& & & & & & & & & \vdots & \cdots & \cdots & \vdots & \vdots \\
& & & & & & & & & l_{1,Q-1} & \cdots & \cdots & l_{P,Q-1} & \vdots \\
& & & & & & & & & & & & & \cdot \cdot \cdot
\end{bmatrix} \quad (4)$$

In (4) $l_{i,j}$ are the coefficients of the new synthesis filter bank.

If the system during the switching operation still has to be perfect reconstructing, the filter coefficients $f_{i,j}$ and $l_{i,j}$ can not be chosen at will. According to the inventive concept the coefficients $f_{i,j}$ and $l_{i,j}$ have to be derived by a linear transformation from the coefficients h and g respectively. This linear transformation will be discussed below. The transformation is performed by selecting one or more blocks of rows from the A operator comprising h coefficients, and multiplying the "partial matrix" B obtained by an invertible transformation matrix T. The result of said transformation is a partial matrix C which contains one or more blocks of rows of the A matrix comprising f coefficients.

The number of blocks to be selected from the A matrix for calculating the transform depends on the number of filters in the filter bank 14 before and after switching. The size of the partial matrix must be such that after transformation, it contains an integer number of blocks comprising f coefficients. This means that the number of rows of the partial matrix must be an integer number times the least common multiple (lcm) of N and P.

A similar operation has to be performed on the synthesis matrix S. The transformation is performed by selecting one or more blocks of columns from the A operator S comprising g coefficients, and multiplying the "partial matrix" U obtained by the inverse of the transformation matrix T. The result of said transformation is a partial matrix V which contains one or more blocks of columns of the A matrix comprising l coefficients.

In the following an example of such transformations is given. The transformation of a filterbank with two filters to a filter bank with four filters is considered. The A matrix of the example filter before switching is equal to:

$$\begin{bmatrix}
\cdot \cdot \cdot & \vdots & \vdots & & & & & \\
& -0.146 & 0.854 & 0.854 & -0.146 & & & \\
& -0.146 & 0.854 & -0.854 & 0.146 & & & \\
& & & -0.146 & 0.854 & 0.854 & -0.146 & \\
& & & -0.146 & 0.854 & -0.854 & 0.146 & \\
& & & & & -0.146 & 0.854 & 0.854 & -0.146 \\
& & & & & -0.146 & 0.854 & -0.854 & 0.146 \\
& & & & & & & \vdots & \vdots & \cdot \cdot \cdot
\end{bmatrix} \quad (5)$$

The S matrix corresponding to the example filter is equal to:

$$\begin{bmatrix}
\cdot \cdot \cdot & & & & & & & \\
0.104 & 0.104 & & & & & & \\
0.604 & 0.604 & & & & & & \\
0.604 & -0.604 & 0.104 & 0.104 & & & & \\
0.104 & -0.104 & 0.604 & 0.604 & & & & \\
& & 0.604 & -0.604 & 0.104 & 0.104 & & \\
& & 0.104 & -0.104 & 0.604 & 0.604 & & \\
& & & & 0.604 & -0.604 & & \\
& & & & 0.104 & -0.104 & & \\
& & & & & & & \cdot \cdot \cdot
\end{bmatrix} \quad (6)$$

If a switch has to be made from the filter bank with two filters (N=2) to a filter bank with four filters (P=4), the blocks to be selected from the operator A have to comprise lcm(2,4) =4 rows. In the same way is found that the blocks to be selected from the operator S comprises 4 columns.

For the partial matrix B we have now $$\begin{bmatrix} -0.146 & 0.854 & 0.854 & -0.146 & 0 & 0 \\ -0.146 & 0.854 & -0.854 & 0.146 & 0 & 0 \\ 0 & 0 & -0.146 & 0.854 & 0.854 & -0.146 \\ 0 & 0 & -0.146 & 0.854 & -0.854 & 0.146 \end{bmatrix} \quad (7)$$

Using a transform matrix T=

$$\begin{bmatrix} 0.749 & -0.258 & 0.749 & 0.258 \\ 0.610 & 0.100 & -0.610 & 0.100 \\ -0.063 & -0.608 & -0.063 & 0.608 \\ 0.098 & -0.530 & -0.098 & -0.530 \end{bmatrix} \quad (8)$$

in the transformation T·B results in a partial matrix C=

$$\begin{bmatrix} -0.072 & 0.419 & 0.712 & 0.712 & 0.419 & -0.072 \\ -0.104 & 0.606 & 0.510 & -0.510 & -0.606 & 0.104 \\ 0.098 & -0.573 & 0.385 & 0.385 & -0.573 & 0.098 \\ 0.063 & -0.369 & 0.628 & -0.628 & 0.369 & -0.063 \end{bmatrix} \quad (9)$$

Consequently for the operator A describing the switching operation can be written:

$$\begin{bmatrix} \ddots & & & & & & & \\ & -0.146 & 0.854 & 0.854 & -0.146 & & & \\ & -0.146 & 0.854 & -0.854 & 0.146 & & & \\ & & & -0.072 & 0.419 & 0.712 & 0.712 & 0.419 & -0.072 \\ & & & -0.104 & 0.606 & 0.510 & -0.510 & -0.606 & 0.104 \\ & & & 0.098 & -0.573 & 0.385 & 0.385 & -0.573 & 0.098 \\ & & & 0.063 & -0.369 & 0.628 & -0.628 & 0.369 & -0.063 \\ & & & & & & & & \ddots \end{bmatrix} \quad (10)$$

For the partial matrix U can be written:

$$\begin{bmatrix} 0.104 & 0.104 & 0 & 0 \\ 0.604 & 0.604 & 0 & 0 \\ 0.604 & -0.604 & 0.104 & 0.104 \\ 0.104 & -0.104 & 0.604 & 0.604 \\ 0 & 0 & 0.604 & -0.604 \\ 0 & 0 & 0.104 & -0.104 \end{bmatrix} \quad (11)$$

With the inverse transform matrix $T^{-1}$=

$$\begin{bmatrix} 0.645 & 0.795 & -0.274 & 0.150 \\ -0.067 & 0.147 & -0.794 & -0.915 \\ 0.645 & -0.795 & -0.274 & -0.150 \\ 0.067 & 0.147 & 0.794 & -0.915 \end{bmatrix} \quad (12)$$

in the transformation $U \cdot T^{-1}$ for the partial matrix V is found:

$$\begin{bmatrix} 0.060 & 0.098 & -0.111 & -0.079 \\ 0.349 & 0.569 & -0.644 & -0.462 \\ 0.503 & 0.324 & 0.368 & 0.532 \\ 0.503 & -0.324 & 0.368 & -0.532 \\ 0.349 & -0.569 & -0.644 & 0.642 \\ 0.060 & -0.098 & -0.111 & 0.079 \end{bmatrix} \quad (13)$$

For the operator S describing the switching operation is finally found:

$$\begin{bmatrix} \ddots & & & & & & \\ -0.104 & 0.104 & & & & & \\ 0.604 & 0.604 & & & & & \\ 0.604 & -0.604 & 0.060 & 0.098 & -0.111 & -0.079 \\ 0.104 & -0.104 & 0.349 & 0.569 & -0.644 & -0.462 \\ & & 0.503 & 0.324 & 0.368 & 0.532 \\ & & 0.503 & -0.324 & 0.368 & -0.532 \\ & & 0.349 & -0.569 & -0.644 & 0.462 \\ & & 0.060 & -0.098 & -0.111 & 0.079 \\ & & & & & & \ddots \end{bmatrix} \quad (14)$$

If the operators S and A according to (10) and (14) respectively are multiplied, a matrix substantially equal to an infinite identity matrix is found. When actually calculating S·A, some deviation from the unity matrix may be found. This deviation is due to the limited accuracy of the representation of the filter coefficients. However this deviation can be reduced at will by increasing the accuracy of the representation of the filter coefficients.

It is observed that the transformation matrices T and $T^{-1}$ need not to be square. If the product of sample rate per filtered signal and the number of filters is not constant, it is possible to have non-square matrices T and $T^{-1}$.

Figure 2A:
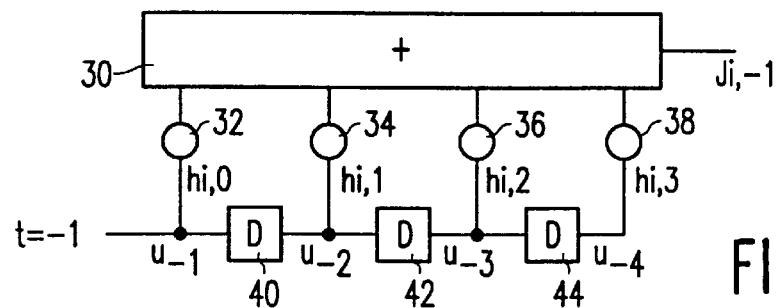
FIG. 2, the state of an analysis filter during the switching process
Figure 2B:
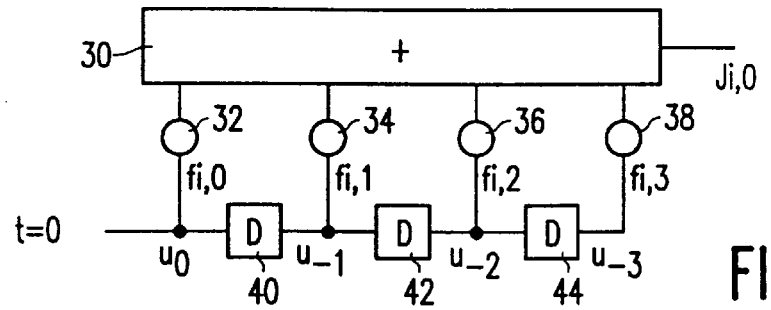
Figure 2C:
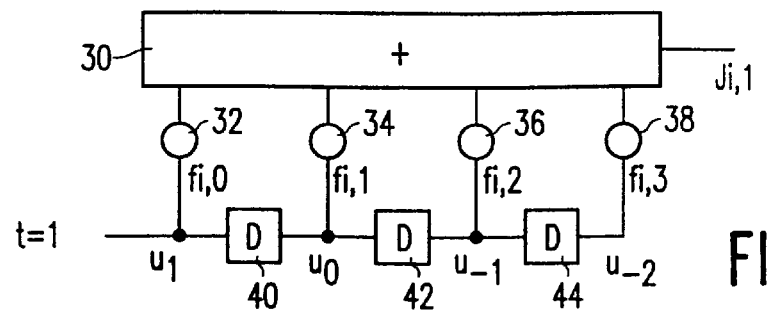
Figure 3A:
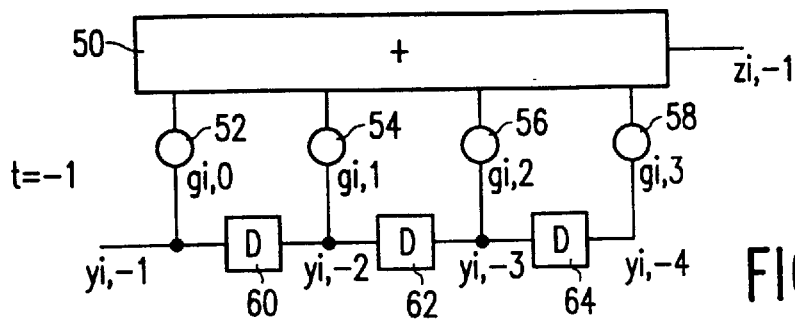
FIG. 3, the state of a synthesis filter during the switching process.
Figure 3B:
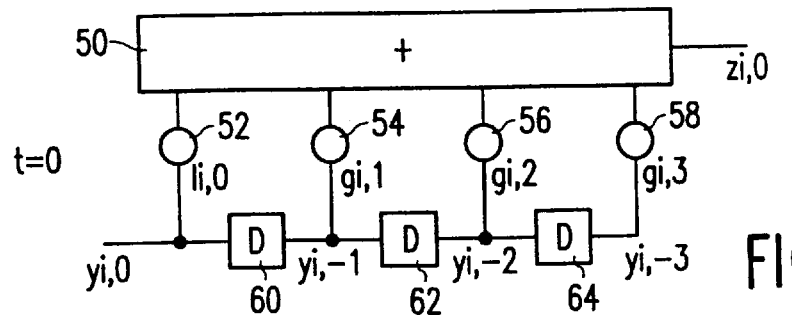
Figure 3C:
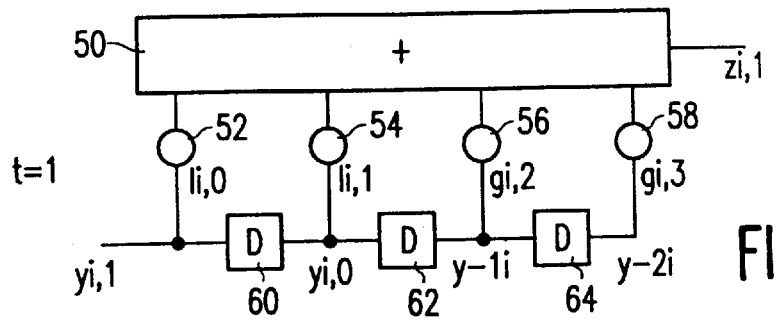
Figure 3D:
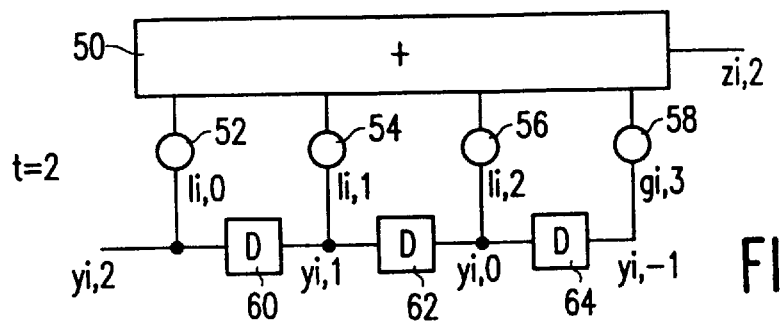
Figure 3E:
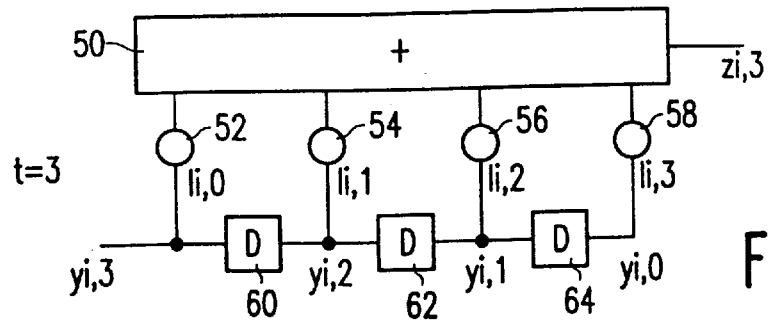

In the FIR filter according to FIG. 2 an input is connected to an input of a delay element 40 and to an input of a multiplier 32. An output of the delay element 40 is connected to an input of a delay element 42 and to an input of a multiplier 34. An output of the delay element 42 is connected to an input of a delay element 44 and to an input of a multiplier 36. The output of the delay element 44 is connected to an input of a multiplier 38. The outputs of the multipliers 32, 43, 36 and 38 are connected to a corresponding input of an adder 30. The output of the adder 30 constitutes the output of the filter.

FIG. 2 shows an implementation of a switch of the analysis filter bank using FIR filters. It is assumed that the length of the impulse response remains the same for ease of explanation, but it is clear that the length of the impulse response may change at a switch of filter parameters.

At the instant t=−1, the switch is not performed yet, and the coefficients of the $i^{th}$ filter are $h_{i,0}$, $h_{i,1}$, $h_{i,2}$ and $h_{i,3}$. The output sample $y_{i,-1}$ is equal to $$y_{i,-1}=h_{i,0} \cdot u_{-1}+h_{i,1} \cdot u_{-2}+h_{i,2} \cdot u_{-3}+h_{i,3} \cdot u_{-4} \tag{15}$$

At instant t=0 the switch is performed, and all filter coefficients are simultaneously changed. The output signal $y_{i,0}$ is consequently equal to:

$$y_{i,0}=f_{i,0} \cdot u_0+f_{i,1} \cdot u_{-1}+f_{i,2} \cdot u_{-2}+f_{i,3} \cdot u_{-3} \tag{16}$$

At t=1 no change takes place in the filter coefficients any more. The output signal $y_{i,1}$ is equal to:

$$y_{i,1}=f_{i,0} \cdot u_1+f_{i,1} \cdot u_0+f_{i,2} \cdot u_{-1}+f_{i,3} \cdot u_{-2} \tag{17}$$

In the FIR filter according to FIG. 3 an input is connected to an input of a delay element 60 and to an input of a multiplier 52. An output of the delay element 60 is connected to an input of a delay element 62 and to an input of a multiplier 54. An output of the delay element 62 is connected to an input of a delay element 64 and to an input of a multiplier 56. The output of the delay element 64 is connected to an input of a multiplier 58. The outputs of the multipliers 52, 54, 56 and 58 are connected to a corresponding input of an adder 50. The output of the adder 50 constitutes the output of the filter.

FIG. 3 shows an implementation of a switch of the synthesis filter bank using FIR filters. Again it is assumed that the length of the impulse response remains the same. At t=−1 the switch is not performed yet, and the output signal $z_{-i,-1}$ is equal to:

$$z_{i,-1}=g_{i,0} \cdot y_{i,-1}+g_{i,1} \cdot y_{i,-2}+g_{i,2} \cdot u_{1,-3}+g_{i,3} \cdot u_{i,-4} \tag{18}$$

At the switching instant t=0, now not all filter coefficient values are modified, but only the first one. $z_{0,i}$ is not equal to: From (19) it can be seen that the coefficients of the filters in the synthesis filter bank are $$z_{i,0}=l_{i,0} \cdot y_{i,0}+g_{i,1} \cdot y_{i,-1}+g_{i,2} \cdot y_{i,-2}+g_{i,3} \cdot y_{i,-3} \tag{19}$$

changed piecemeal. For the output signals $z_{i,1}$, $z_{i,2}$ and $z_{i,3}$ can now be written:

$$z_{i,1}=l_{i,0} \cdot y_{i,1}+l_{i,1} \cdot y_{i,0}+g_{i,2} \cdot y_{i,-1}+g_{i,3} \cdot y_{i,-2} \tag{20}$$

$$z_{i,2}=l_{i,0} \cdot y_{i,2}+l_{i,1} \cdot y_{i,1}+l_{i,2} \cdot y_{i,0}+g_{i,3} \cdot y_{i,-1} \tag{21}$$

$$z_{i,3}=l_{i,0} \cdot y_{i,3}+l_{i,1} \cdot y_{i,2}+l_{i,2} \cdot y_{i,0}+l_{i,3} \cdot y_{i,1} \tag{22}$$

The switching operation according to (18)–(21) results in an instantaneous change of the impulse response of the filter without any transient phenomena.

Figure 4:
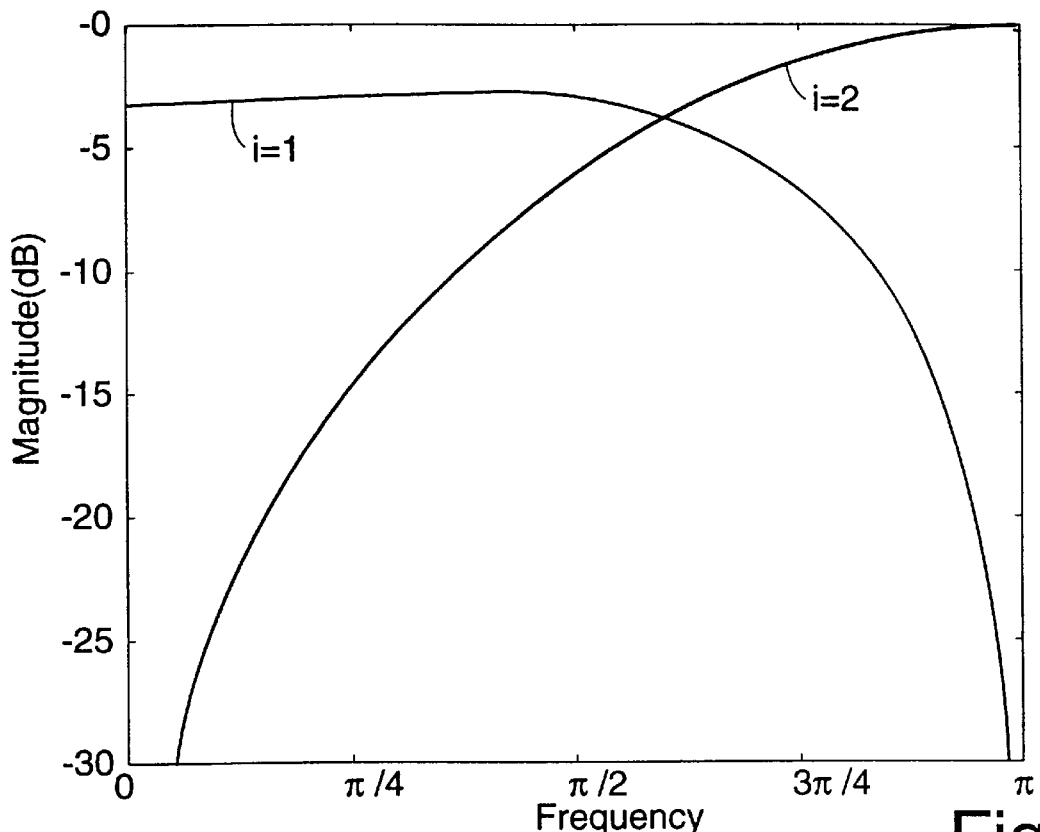
FIG. 4, the transfer function of an example of an analysis filter bank before switching.

FIG. 4 shows the amplitude transfer function of the filter bank according to (5). It can be seen that the input signal is split up in two sub-band signals.

Figure 5:
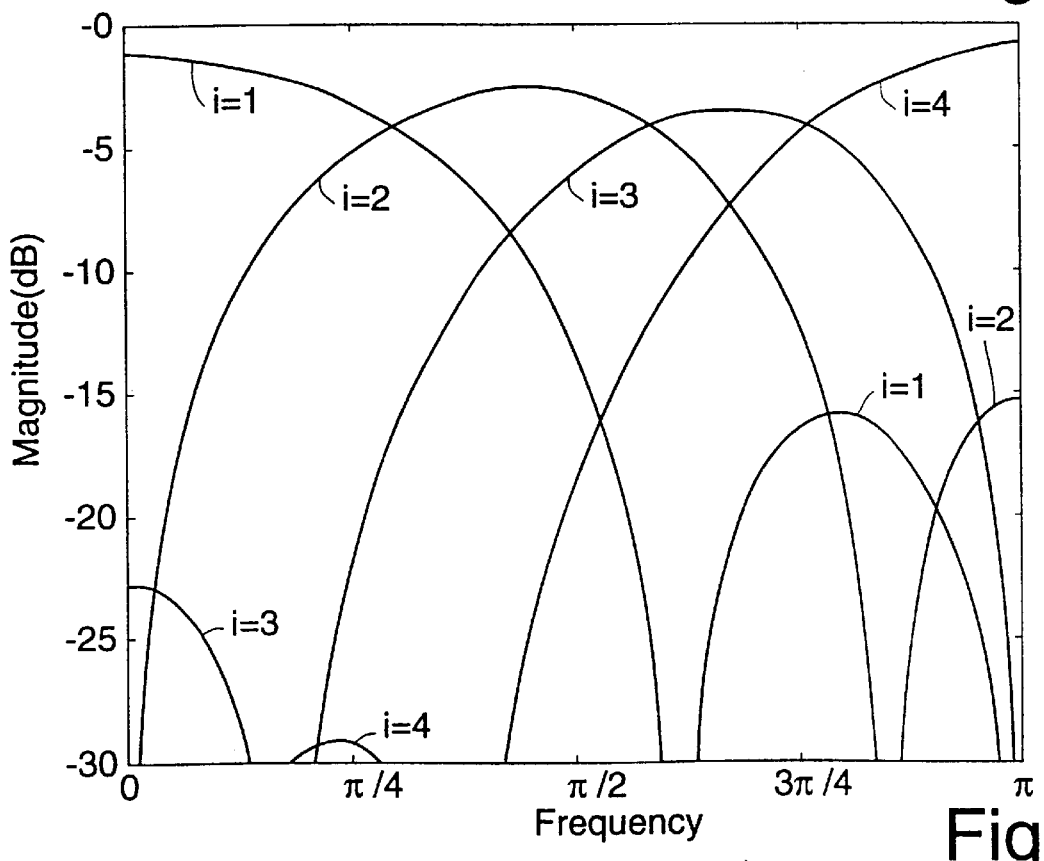
FIG. 5, the transfer function of an example of an analysis filter bank after switching.

FIG. 5 shows the amplitude transfer function of the four filters of the analysis filter bank according to the right block of (14). It can be seen now that the input signal is split up in four subband signals.

What is claimed is:

1. A transmission system comprised of a transmitter and a receiver:
    said transmitter comprising:
        a time-dependent analysis filter bank for deriving, from at least one input signal, at least two filtered signals;
        encoding means for deriving encoded signals from the at least two filtered signals;
        first switching means for changing filter coefficients of the time-dependent analysis filter bank to effect a first linear transformation based on the at least one input signal, the first switching means changing the filter coefficients prior to the time-dependent analysis filter bank deriving the at least two filtered signals, and the first switching means generating a switching signal containing information pertaining to changing the filter coefficients; and
        transmitting means for transmitting the encoded signals and the switching signal to a receiver via a transmission medium; and
    said receiver comprising:
        decoding means for deriving said at least two filtered signals from the encoded signals;
        a time-dependent synthesis filter bank for reconstructing said at least one input signal from the at least two filtered signals; and
        second switching means for changing filter coefficients of the time-dependent synthesis filter bank to effect a second linear transformation based on the switching signal. the second switching means changing the filter coefficients prior to the time-dependent synthesis filter bank reconstructing the at least one input signal, and the second linear transformation being inverse to the first linear transformation.

2. A transmission system according to claim 1, wherein the first switching means is arranged for instantaneously changing the filter coefficients of the time-dependent analysis filter bank, and the second switching means is arranged for instantaneously changing an impulse response of the time-dependent synthesis filter bank.

3. A transmitter comprising:
    a time-dependent analysis filter bank for deriving, from at least one input signal, at least two filtered signals;
    encoding means for deriving encoded signals from the at least two filtered signals;
    switching means for changing filter coefficients of the time-dependent analysis filter bank to effect a linear transformation based on the at least one input signal, the switching means changing the filter coefficients prior to the time-dependent analysis filter bank deriving the at least two filtered signals, and the switching means generating a switching signal containing information pertaining to changing the filter coefficients; and
    transmitting means for transmitting the encoded signals and the switching signal to a receiver via a transmission medium.

4. A transmitter according to claim 3, wherein the switching means is arranged for instantaneously changing the filter coefficients of the time-dependent analysis filter bank.

5. A receiver comprising:
    a receiving means for receiving encoded signals and a switching signal from a transmitter, the switching signal containing information pertaining to changing filter coefficients in the transmitter;

a decoding means for deriving at least two partial signals from the encoded signals;

a synthesis filter bank for reconstructing at least one input signal from the at least two partial signals; and switching means for changing filter coefficients of the synthesis filter bank to effect a linear transformation based on the switching signal, the switching means changing the filter coefficients prior to the synthesis filter bank reconstructing the at least one input signal.

6. A receiver according to claim 5, wherein the switching means is arranged for instantaneously changing an impulse response of the synthesis filter bank.

7. An encoder comprising:

a time-dependent analysis filter bank for deriving, from at least one signal, at least two filtered signals;

coding means for deriving encoded signals from the at least two filtered signals;

switching means for changing filter coefficients of the time-dependent analysis filter bank to effect a linear transformation based on the at least one signal, the switching means changing the filter coefficients prior to the time-dependent analysis filter deriving the at least two filtered signals, and the switching means generating a switching signal containing information pertaining to changing the filter coefficients; and transmitting means for transmitting the encoded signals and the switching signal to a decoder.

8. An encoder according to claim 7, wherein the switching means is arranged for instantaneously changing the filter coefficients of the time-dependent analysis filter bank.

9. A decoder comprising:

a receiving means for receiving encoded signals and a switching signal from a transmitter, the switching signal containing information pertaining to changing filter coefficients in the transmitter;

decoding means for deriving at least two partial signals from the encoded signals;

a synthesis filter bank for reconstructing at least one input signal from the at least two partial signals; and switching means for changing the filter coefficients of the synthesis filter bank to effect a linear transformation based on the switching signal, the switching means changing the filter coefficients prior to the synthesis filter bank reconstructing the at least one input signal.

10. A decoder according to claim 9, wherein the switching means is arranged for instantaneously changing the impulse response of the synthesis filter bank.

11. A method of using a time-dependent analysis filter bank in coding at least one input signal, the method comprising the steps of:

changing filter coefficients of the time-dependent analysis filter bank to effect a linear transformation based on the at least one input signal;

generating a switching signal containing information pertaining to changing filter coefficients in the time-dependent analysis filter bank;

deriving, from the at least one input signal, at least two filtered signals using the time-dependent analysis filter bank with changed filter coefficients;

deriving encoded signals from the at least two filtered signals; and transmitting the encoded signals and the switching signal to a receiver.

12. A method of using a time-dependent synthesis filter bank in decoding encoded signals received from a transmitter, the method comprising the steps of:

receiving the encoded signals from the transmitter, together with a switching signal containing information pertaining to changing filter coefficients in the transmitter;

deriving at least two partial signals from the encoded signals;

changing filter coefficients of the time-dependent synthesis filter bank to effect a linear transformation based on the switching signal; and reconstructing at least one decoded signal from the at least two partial signals using the time-dependent synthesis filter bank with changed filter coefficients.

* * * * *